United States Patent
Oh et al.

(10) Patent No.: US 8,703,573 B2
(45) Date of Patent: Apr. 22, 2014

(54) SEMICONDUCTOR DEVICE AND METHOD OF MANUFACTURING THE SAME

(75) Inventors: Gyu-Hwan Oh, Hwaseong-si (KR); Dong-Hyun Kim, Hwaseong-si (KR); Kyung-Min Chung, Hwaseong-si (KR); Dong-Hyun Im, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 211 days.

(21) Appl. No.: 13/422,487

(22) Filed: Mar. 16, 2012

(65) Prior Publication Data

US 2012/0252187 A1     Oct. 4, 2012

(30) Foreign Application Priority Data

Apr. 4, 2011  (KR) ......................... 10-2011-0030855

(51) Int. Cl.
    *H01L 21/20*     (2006.01)
(52) U.S. Cl.
    USPC ..... 438/381; 438/382; 438/666; 257/E21.351
(58) Field of Classification Search
    CPC .................................................. H01L 45/126
    USPC ................................................. 438/382, 381
    See application file for complete search history.

(56) References Cited

U.S. PATENT DOCUMENTS

2011/0300685 A1* 12/2011 Horii et al. ..................... 438/382
2012/0040508 A1*  2/2012 Oh et al. ........................ 438/382

FOREIGN PATENT DOCUMENTS

| KR | 10-2008-0100053 | 11/2008 |
|---|---|---|
| KR | 10-2010-0052310 | 5/2010 |
| KR | 10-2010-0082604 | 7/2010 |

OTHER PUBLICATIONS

English Abstract for Publication No. 10-2008-0100053.
English Abstract for Publication No. 10-2010-0052310.
English Abstract for Publication No. 10-2010-0082604.

* cited by examiner

*Primary Examiner* — Charles Garber
*Assistant Examiner* — Alia Sabur
(74) *Attorney, Agent, or Firm* — F. Chau & Associates, LLC

(57) ABSTRACT

A method of manufacturing the semiconductor device includes sequentially forming first to third mold layer patterns on a substrate and spaced apart from each other, forming a first semiconductor pattern between the first mold layer pattern and the second mold layer pattern, and a second semiconductor pattern between the second mold layer pattern and the third mold layer pattern, forming a first trench between the first mold layer pattern and the third mold layer pattern by removing a portion of the second mold layer pattern and portions of the first and second semiconductor patterns, depositing a material for a lower electrode conformally along side and bottom surfaces of the first trench, and forming first and second lower electrodes separated from each other on the first and second semiconductor patterns, respectively, by removing a portion of the material for a lower electrode positioned on the second mold layer pattern.

20 Claims, 15 Drawing Sheets

SEMICONDUCTOR DEVICE AND METHOD OF MANUFACTURING THE SAME

CROSS-REFERENCE TO RELATED APPLICATION

This application claims priority under 35 U.S.C. 119 to Korean Patent Application No. 10-2011-0030855 filed on Apr. 4, 2011, the disclosure of which is hereby incorporated by reference herein in its entirety.

BACKGROUND

1. Technical Field

The present invention relates to a semiconductor device and a method of manufacturing the same, and more particularly, to a phase change memory device and a method of manufacturing the same.

2. Description of the Related Art

As an integration degree of a semiconductor increases, patterns forming a circuit are miniaturized and a gap between adjacent patterns is decreasing. To form contact holes in a smaller size, double patterning may be used.

For example, in the double patterning process, photoresist patterns are formed by performing photolithography twice between photoresist patterns at a pitch of photolithographic resolution restrictions. Thus, contact holes or patterns at a pitch not exceeding photolithographic resolution restrictions can be formed using double patterning.

A phase change random access memory (PRAM) is a device that stores data using a phase change material making transitions between amorphous and crystalline states when it is cooled after being heated. A PRAM generally includes diodes, a lower electrode and a phase change material. To fabricate a PRAM having fine patterns, double patterning may be performed when forming the diodes, the lower electrode and the phase change material, respectively.

However, conventional double patterning processes involve two photolithography processes, which may require high-priced equipment and application of a complex sequence of processes. Therefore, fabricating a PRAM with fine patterns by performing multiple double patterning processes may increase the manufacturing cost and process time.

Accordingly, there is a need for manufacturing a PRAM with fine patterns while performing a minimum number of double patterning processes.

SUMMARY

Exemplary embodiments of the present invention may provide a semiconductor device, which can minimize the number of double patterning processes while manufacturing a phase change random access memory having fine patterns, and a method of manufacturing the same.

According to an embodiment of the present invention, there is provided a method of manufacturing the semiconductor device. The method includes sequentially forming first to third mold layer patterns on a substrate. The first to third mold layer patterns are spaced apart from each other. The method further includes forming a first semiconductor pattern disposed between the first mold layer pattern and the second mold layer pattern, and a second semiconductor pattern between the second mold layer pattern and the third mold layer pattern, forming a first trench between the first mold layer pattern and the third mold layer pattern by removing a portion of the second mold layer pattern and portions of the first and second semiconductor patterns, depositing a material for a lower electrode conformally along side and bottom surfaces of the first trench, and forming first and second lower electrodes separated from each other on the first and second semiconductor patterns, respectively, by removing a portion of the material for a lower electrode positioned on the second mold layer pattern.

According to an exemplary embodiment of the present invention, there is provided a method of manufacturing a semiconductor device. The method includes forming a first mold layer pattern on a substrate, and first and second semiconductor patterns on opposing sidewalls of the first mold layer pattern, depositing a first mold layer on the substrate, the first mold layer pattern, and the first and second semiconductor patterns, forming a second mold layer pattern on side surfaces of the first semiconductor pattern and a third mold layer pattern on side surfaces of the second semiconductor pattern by planarizing the first mold layer to expose a top surface of the first mold layer pattern and top surfaces of the first and second semiconductor patterns, forming a first trench between the second mold layer pattern and the third mold layer pattern by removing a portion of the first mold layer pattern and portions of the first and second semiconductor patterns, depositing a material for a lower electrode conformally along side and bottom surfaces of the first trench, and forming first and second lower electrodes separated from each other on the first and second semiconductor patterns, respectively, by removing a portion of the lower electrode material positioned on the first mold layer pattern.

In accordance with an exemplary embodiment of the present invention, a method of manufacturing a semiconductor device is provided. The method includes forming a first isolation region, a second isolation region, a third isolation region and a fourth isolation region spaced apart from each other in a semiconductor substrate, forming a first diode electrode between the first and second isolation regions, a second diode electrode between the second and third diode electrodes, a third diode electrode between the third and fourth isolation regions and a fourth diode electrode on a side of the fourth isolation region opposite to a side of the fourth isolation region on which the third diode electrode is formed, sequentially forming an etch stop layer and a first mold layer on the substrate, and forming a first mold layer pattern and a second mold layer pattern by patterning the first mold layer and the etch stop layer using a double patterning process and the first and second mold layer patterns have inclined sidewalls.

The method further includes forming a semiconductor layer conformally on the substrate and the first and second mold layer patterns, patterning the semiconductor layer to form a first semiconductor pattern and a second semiconductor pattern on opposing sidewalls of the first mold layer pattern and a third semiconductor pattern and a fourth semiconductor pattern on opposing sidewalls of the second mold layer pattern and the second and third semiconductor patterns are positioned between the first and second mold layer patterns and spaced apart from each other, forming a third mold layer pattern on a sidewall of the first semiconductor pattern and on the first isolation region and a fourth mold layer pattern on the third isolation region and between the second and third semiconductor patterns and the opposing sidewalls of each of the third and fourth mold layer patterns are inclined, forming a first trench between the third mold layer pattern and the fourth mold layer pattern by removing a portion of the first mold layer pattern and portions of the first and second semiconductor patterns, foaming a second trench on the second mold layer pattern and the third and fourth semiconductor patterns by removing a portion of the second mold layer pattern and portions of the third and fourth semiconductor patterns, transforming the first and second semiconductor patterns into a fifth diode electrode and a sixth diode electrode, respectively, by implanting dopants of a first conductivity type into the first and second semiconductor patterns, and transforming the third and fourth semiconductor patterns into a seventh diode electrode and an eighth diode electrode, respectively, by implanting dopants of the first conductivity type into the third and fourth semiconductor patterns.

In addition, the method further includes forming a first ohmic layer pattern on the fifth diode electrode, a second ohmic layer pattern on sixth diode electrode, a third ohmic layer pattern on the seventh diode electrode and a fourth ohmic layer pattern on the eighth diode electrode, forming a material for a lower electrode conformally alone side and bottom surfaces of the first trench and the second trench, forming a first lower electrode and second lower electrode separated from each other on the fifth diode electrode and the sixth diode electrode, respectively by removing a portion of the lower electrode material positioned on the first mold layer pattern and forming a third lower electrode and fourth lower electrode separated from each other on the seventh diode electrode and the eighth diode electrode, respectively by removing a portion of the lower electrode material positioned on the second mold layer pattern.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS

Figure 1:
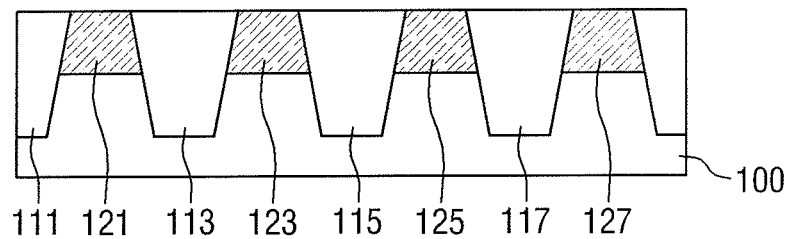
FIGS. 1 to 17 are cross-sectional views of a semiconductor device, for explaining a method of manufacturing a semiconductor device according to an exemplary embodiment of the present invention.

Exemplary embodiments of the present invention may be understood more readily by reference to the following detailed description and the accompanying drawings. Exemplary embodiments of the present invention may, however, be embodied in many different forms and should not be construed as being limited to exemplary embodiments set forth herein. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present.

Like numbers refer to like elements throughout. As used herein, the term "and/or" includes any and all combinations of one or more of the associated listed items.

As used herein, the singular forms "a", "an" and "the" are intended to include the plural forms as well, unless the context clearly indicates otherwise.

Hereinafter, a method of manufacturing a semiconductor device according to an embodiment of the present invention will be described with reference to FIGS. 1 to 17. FIGS. 1 to 17 are cross-sectional views of a semiconductor device, for explaining a method of manufacturing a semiconductor device according to an embodiment of the present invention.

For example, referring first to FIG. 1, first to fourth isolation regions 111, 113, 115 and 117 and first to fourth diode electrodes 121, 123, 125, and 127 of a second conductivity type are formed on a substrate 100.

The substrate 100 may be, for example, a semiconductor substrate including silicon or germanium, and may have a first conductivity type (e.g., P-type). A plurality of active regions may be defined in the substrate 100 by forming the first to fourth isolation regions 111, 113, 115 and 117 spaced apart from each other and sequentially disposed in the substrate 100. The plurality of active regions may extend, for example, in a first direction and may be parallel with each other. The first to fourth diode electrodes 121, 123, 125 and 127 of second conductivity type may be formed by, for example, implanting second conductivity type (e.g., N-type) dopants into the plurality of active regions.

Consequently, the first diode electrode 121 may be positioned between the first and second isolation regions 111 and 113, the second diode electrodes 123 may be positioned between the second and third isolation regions 113 and 115, the third diode electrode 125 may be positioned between the third and fourth isolation regions 115 and 117, and the fourth diode electrode 127 may be positioned on side surfaces of the fourth isolation region 117.

Figure 2:
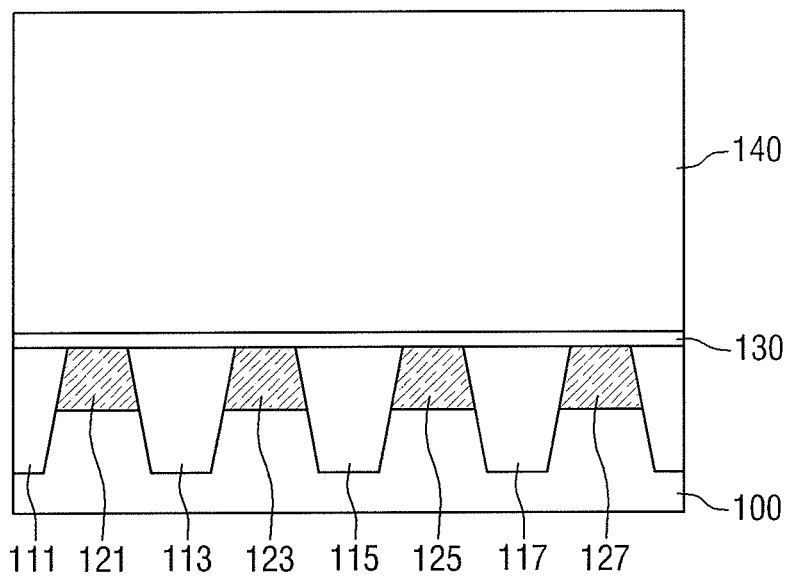

Next, referring to FIG. 2, an etch stopper layer 130 and a first mold layer 140 are sequentially deposited on the substrate 100.

The etch stopper layer 130 may include, for example, silicon nitride (SiN). In addition, the first mold layer 140 may include, for example, one selected from the group consisting of silicon dioxide ($SiO_2$), SiN and silicon carbide (SiC).

Figure 3:
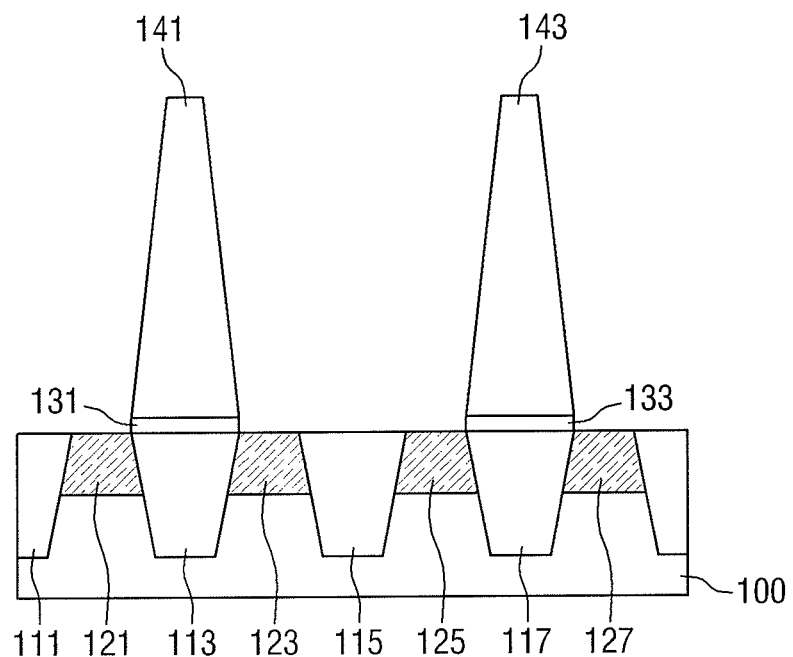

Referring to FIG. 3, a first mold layer pattern 141 and a second mold layer pattern 143 are formed by patterning the first mold layer 140. In addition, the ethc stop layer 130 is also patterned to form etch stop layer pattern 133.

For example, to form the first and second mold layer patterns 141 and 143, a double patterning process, may be performed. A space between the first mold layer pattern 141 and the second mold layer pattern 143 may be adjusted to be, for example, half-pitch by performing a double patterning process on the first mold layer 140. As a result, the first and second mold layer patterns 141 and 143 are sequentially disposed on the substrate 100 and are separated from each other.

As shown in FIG. 3, the first and second mold layer patterns 141 and 143 may, for example, taper upwardly. That is to say, sidewalls of the first and second mold layer patterns 141 and 143 may be inclined.

The first and second mold layer patterns 141 and 143 may be formed on different isolation regions. For example, the first mold layer pattern 141 may be formed on the second isolation region 113 and the second mold layer pattern 143 may be formed on the fourth isolation region 117. That is to say, the first mold layer pattern 141 and the second mold layer pattern 143 may be formed on isolation regions that are not adjacent to each other.

Figure 4:
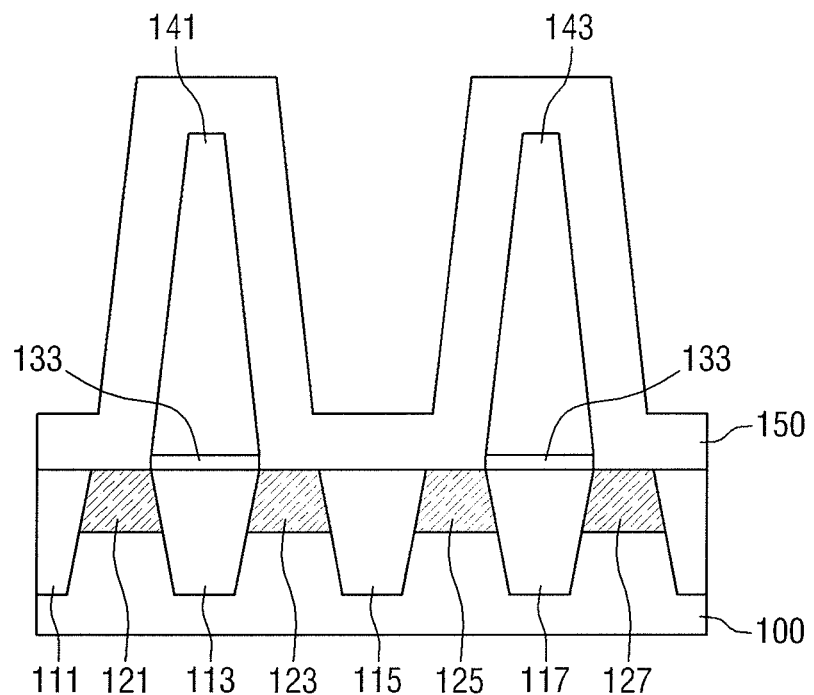

Next, referring to FIG. 4, a semiconductor layer 150 is formed conformally on the substrate 100 and the first and second mold layer patterns 141 and 143.

The semiconductor layer 150 may include, for example, any one of polysilicon (poly-Si), amorphous silicon (Si), silicon germanium (SiGe) and doped poly.

Figure 5:
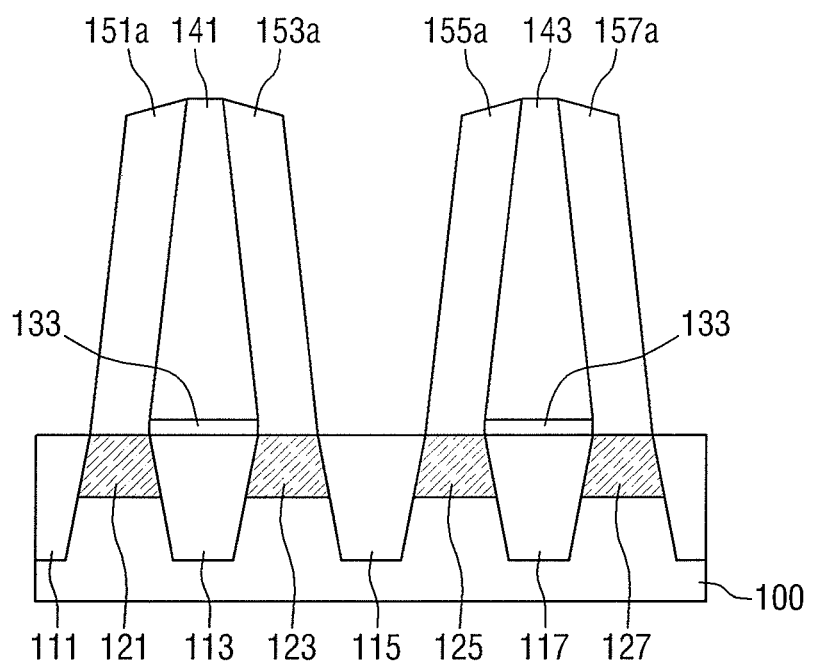

Referring to FIG. 5, first and second semiconductor patterns 151a and 153a are formed on both sidewalls of the first mold layer pattern 141 and third and fourth semiconductor patterns 155a and 157a are formed on both sidewalls of the second mold layer pattern 143 by patterning the semiconductor layer 150. Here, the second semiconductor pattern 153a and the third semiconductor pattern 155a may be, for example, positioned between the first and second mold layer patterns 141 and 143 and may be separated from each other.

As shown in FIG. 5, the first to fourth semiconductor patterns 151a, 153a, 157a and 157a may be shaped of spacers, but exemplary embodiments are not limited thereto.

For example, first and second semiconductor patterns 151a and 153a may be formed on the first and second diode electrodes 121 and 123, respectively, and the third and fourth semiconductor patterns 155a and 157a may be formed on the third and fourth diode electrodes 125 and 127, respectively.

Figure 6:
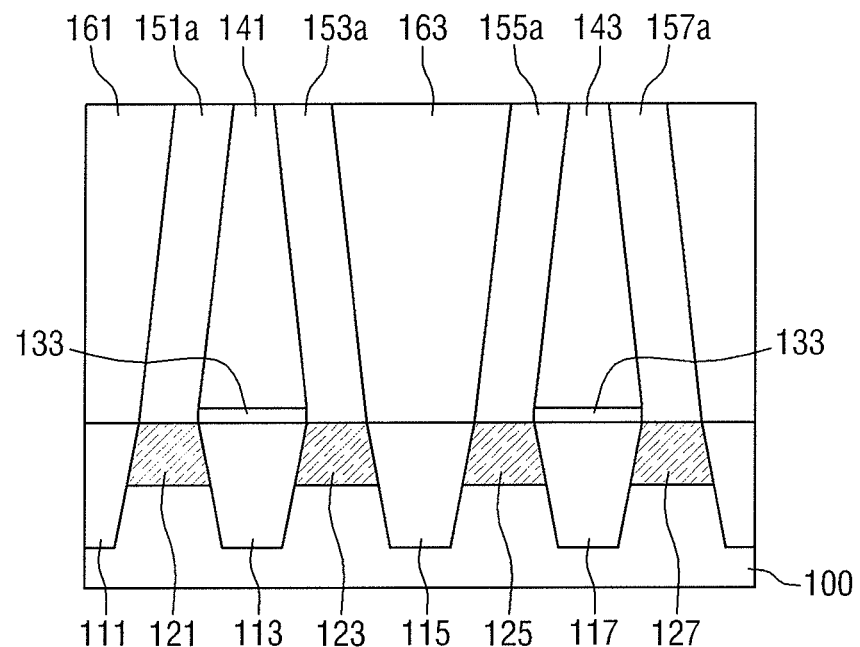

Next, for example, referring to FIG. 6, a third mold layer (not shown) may be formed on the substrate 100, the first and second mold layer patterns 141 and 143, and the first to fourth semiconductor patterns 151a, 153a, 155a and 157a. Here, the third mold layer may be formed to, for example, fill spaces between each of the first to fourth semiconductor patterns 151a, 153a, 155a and 157a. In addition, a third mold layer pattern 161 is formed on side surfaces of the first semiconductor pattern 151a and a fourth mold layer pattern 163 is formed between the second semiconductor pattern 153a and the third semiconductor pattern 155a by, for example, planarizing the third mold layer to expose top surfaces of the first and second mold layer patterns 141 and 143 and top surfaces of the first to fourth semiconductor patterns 151a, 153a, 155a and 157a.

The planarizing of the third mold layer may be performed by, for example, a chemical mechanical polishing (CMP) or etch-back process.

The third mold layer may include, for example, any one of $SiO_2$, SiN and SiC. However, the third mold layer may be formed from a different material from the first mold layer 140. That is to say, the third mold layer may be formed from a material having a different etch rate from the first mold layer 140. Eventually, for example, the first and second mold layer patterns 141 and 143 may be formed from a first material, and the third and fourth mold layer patterns 161 and 163 may be formed from a second material different from the first material.

For example, the third mold layer pattern 161 may be formed on the first isolation region 111, and the fourth mold layer pattern 163 may be formed on the third isolation region 115.

For example, as shown in FIG. 6, the third and fourth mold layer patterns 161 and 163 taper downwardly. That is to say, sidewalls of the third and fourth mold layer patterns 161 and 163 may be inclined.

To sum up, as shown in FIGS. 1 to 6, the third, first and fourth mold layer patterns 161, 141 and 163 are sequentially disposed on the substrate 100 and are separated from each other. The first semiconductor pattern 151a is disposed between the third mold layer pattern 161 and first mold layer pattern 141, and the second semiconductor pattern 153a is disposed between the first mold layer pattern 141 and the fourth mold layer pattern 163. The first mold layer pattern 141 may be formed from a first material and the third mold layer pattern 161 and the fourth mold layer pattern 163 may be formed from a second material different from the first material.

The substrate 100 includes the second, first, third and fourth isolation regions 113, 111, 115 and 117 formed under the first, third, fourth and second mold layer patterns 141, 161, 163 and 143. The second, first and third and fourth isolation regions 113, 111, 115 and 117 are separated from each other by the first diode electrode 121 of a first conductivity type formed between the first and second isolation regions 111 and 113, and the second diode electrode 123 of first conductivity type formed between the second and third isolation regions 113 and 115 and the third diode electrode of first conductivity type formed between the third and fourth isolation regions 115 and 117.

Figure 7:
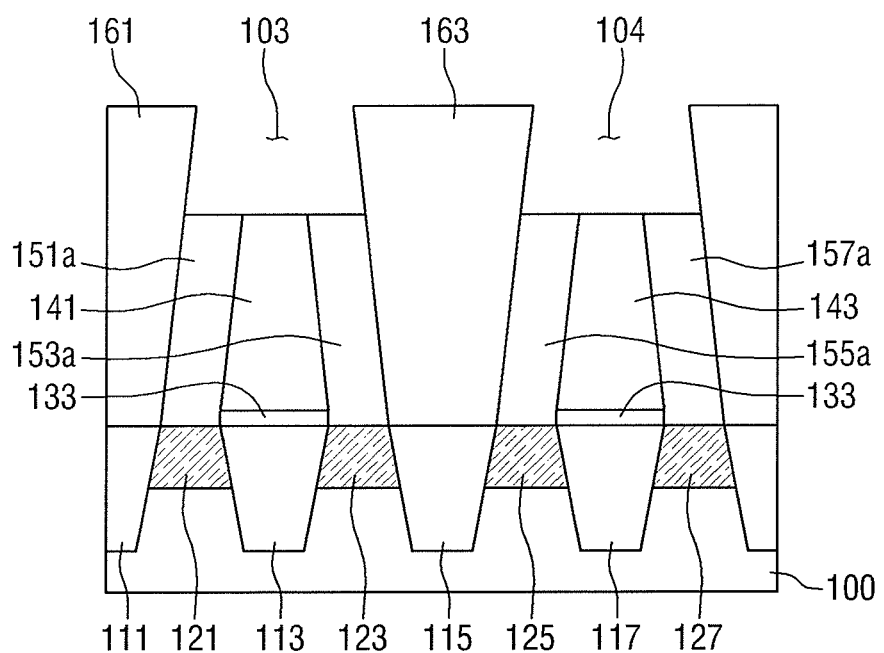

Referring to FIG. 7, a first trench 103 is formed between the third mold layer pattern 161 and the fourth mold layer pattern 163 by, for example, removing a portion of the first mold layer pattern 141 and portions of the first and second semiconductor patterns 151a and 153a. In addition, a second trench 104 is formed on a side of the fourth mold layer pattern 163 which is opposite to a side of the fourth mold layer pattern 163 on which the first trench 103 is formed by removing portions of the third and fourth semiconductor patterns 155a, 157a and the second mold layer pattern 143 in the same manner as forming the first trench 103.

The first mold layer pattern 141 and the second mold layer pattern 143 may be selectively removed using, for example, hydrogen fluoride (HF). For example, as described above, the first mold layer pattern 141 and the second mold layer pattern 143 may be formed from a first material and the third and fourth mold layer patterns 161 and 163 may be formed from a second material different from the first material. Therefore, the first mold layer pattern 141 and the second mold layer pattern 143 may be selectively etched using an etching gas or etching solution having a higher etch rate to the first material than to the second material.

The first to fourth semiconductor patterns 151a, 153a, 155a, and 157a may be removed by, for example, dry etching. For example, the first to fourth semiconductor patterns 151a, 153a, 155a and 157a may be removed by an etch-back process, but exemplary embodiments are not limited thereto.

After the first mold layer pattern 141 and the second mold layer pattern 143 are first removed, the first to fourth semiconductor patterns 151a, 153a, 155a and 157a may then be removed. However, exemplary embodiments of the invention is not limited to the removal order of the illustrated example. Alternatively, the first to fourth semiconductor patterns 151a, 153a, 155a and 157a may first be removed.

Sidewalls of the first trench 103 and the second trench 104 may have, for example, a negative profile. That is to say, the sidewalls of the first trench 103 and the second trench 104 may have a negative slope when a width of the first trench 103 gradually increases downwardly.

Figure 8:
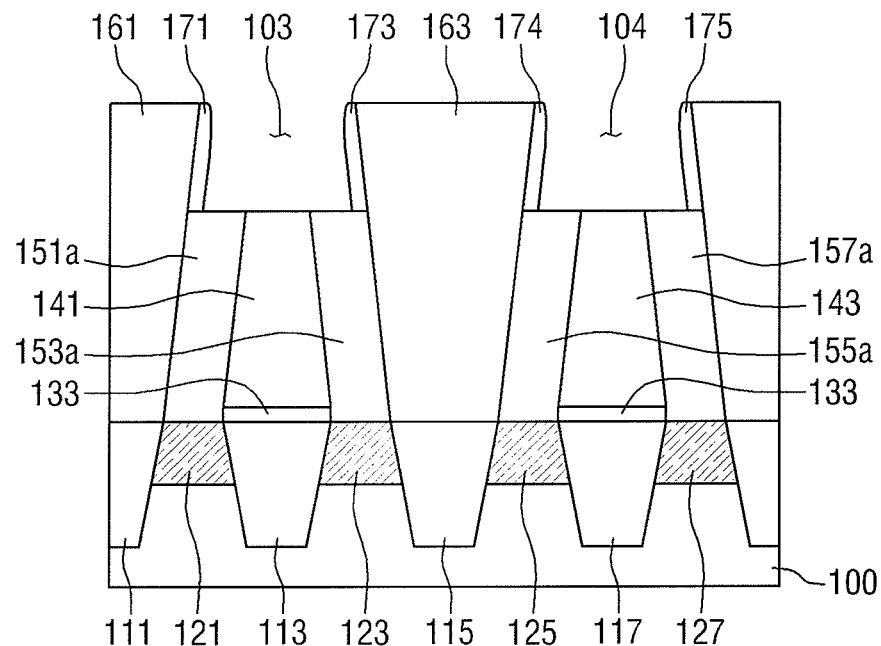

Next, referring to FIG. 8, the first and second spacers 171 and 173 may be formed, for example, on both sidewalls of the first trench 103. Moreover, a third spacer 174 and a fourth spacer 175 may be formed, for example, on both sidewalls of the second trench 104 in a similar manner as the first and second spacers 171 and 173 formed on the sidewalls of the first trench 103.

The first to fourth spacers 171, 173, 174 and 175 may be formed from, for example, a different material from the third and fourth mold layer patterns 161 and 163. That is to say, the third and fourth mold layer patterns 161 and 163 may be formed from a second material and the first to fourth spacers 171, 173, 174 and 175 may be formed from a third material different from the second material. The first to fourth spacers 171, 173, 174 and 175 may include, for example, SiO$_2$.

Figure 9:
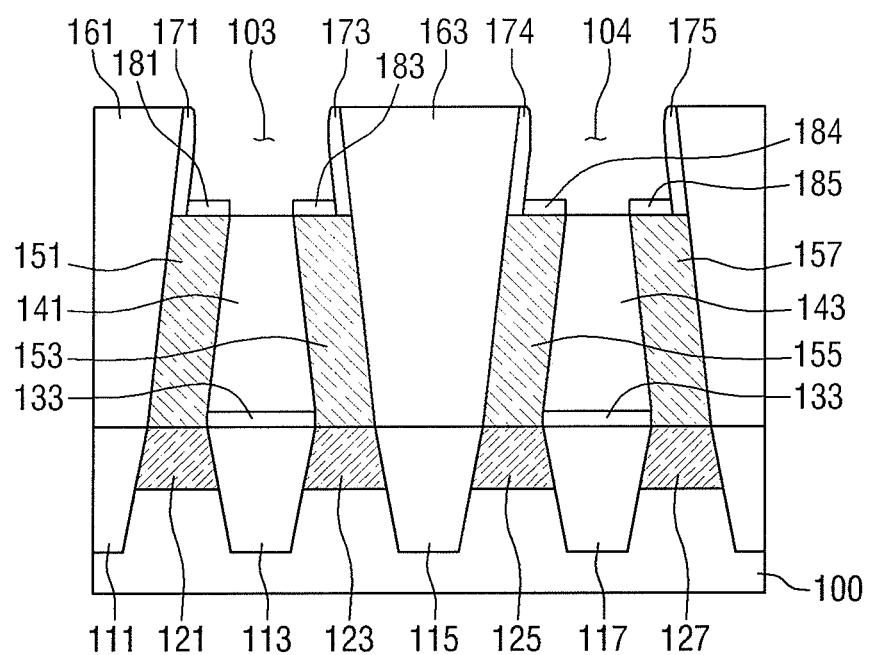

Next, for example, referring to FIG. 9, fifth and sixth diode electrodes 151 and 153 may be formed by implanting first conductivity type (e.g., P-type) dopants into the first and second semiconductor patterns 151a and 153a, respectively and seventh and eighth diode electrodes 155, 157 may be formed by, for example, implanting first conductivity type (e.g., P-type) dopants into the third and fourth semiconductor patterns 155a, and 157a, respectively. In addition, for example, first and second ohmic layer patterns 181 and 183 may be formed on the fifth and sixth diode electrodes 151 and 153, respectively and third and fourth ohmic layer patterns 184 and 185 may be formed on the seventh and eighth diode electrodes 155 and 157, respectively.

For example, fifth and sixth diode electrodes 151 and 153 of first conductivity type (e.g., P-type) are formed on the first and second diode electrode 121 and 123 of second conductivity type (e.g., N-type), respectively and seventh and eighth diode electrodes 155 and 157 of first conductivity type (e.g., P-type) are formed on the third and fourth diode electrodes 125 and 127 of second conductivity type (e.g., N-type), respectively. Thus, the first diode electrode 121, the fifth diode electrode 151, the second diode electrode 123 and the sixth diode electrode 153 constitute vertical diodes, respectively. Moreover, the third diode electrode 125, the seventh diode electrode 155, the fourth diode electrode 127 and the eighth diode electrode 157 also constitute vertical diodes, respectively. The vertical diodes control current passing through a phase change material to be described later.

The first to fourth ohmic layer patterns 181, 183, 184 and 185 may be formed from, for example, a metallic material capable of forming silicide and may include, for example, at least one selected from the group consisting of, for example, titanium (Ti), tantalum (Ta), cobalt (Co), nickel (Ni) and a tungsten silicide (WSi).

Figure 10:
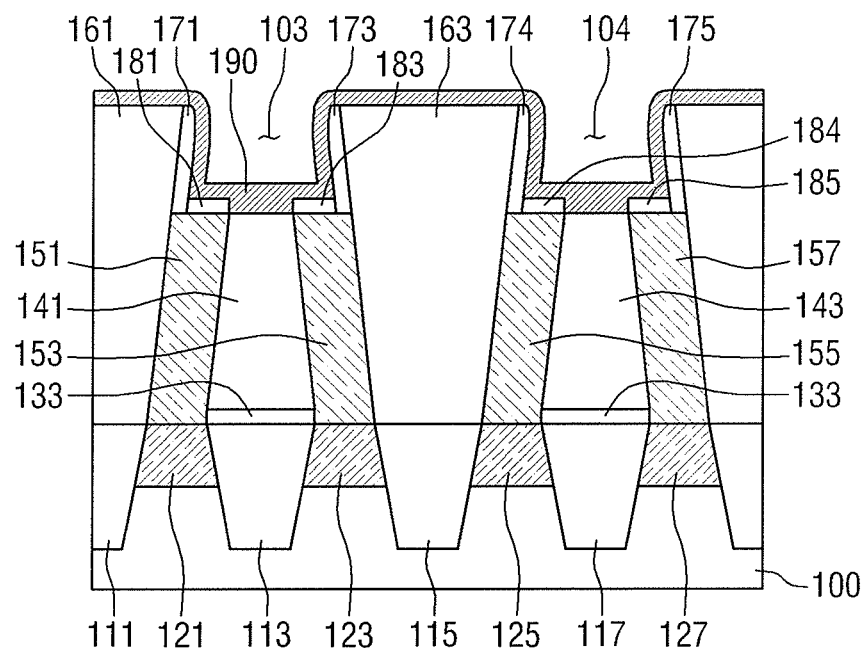

Next, for example, referring to FIG. 10, a material 190 for a lower electrode is deposited conformally along side and bottom surfaces of the first trench 103 and conformally along side and bottom surfaces of the second trench 104.

The lower electrode material 190 may include, for example, at least one selected from the group consisting of carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN) and tantalum silicon nitride (TaSiN).

Figure 11:
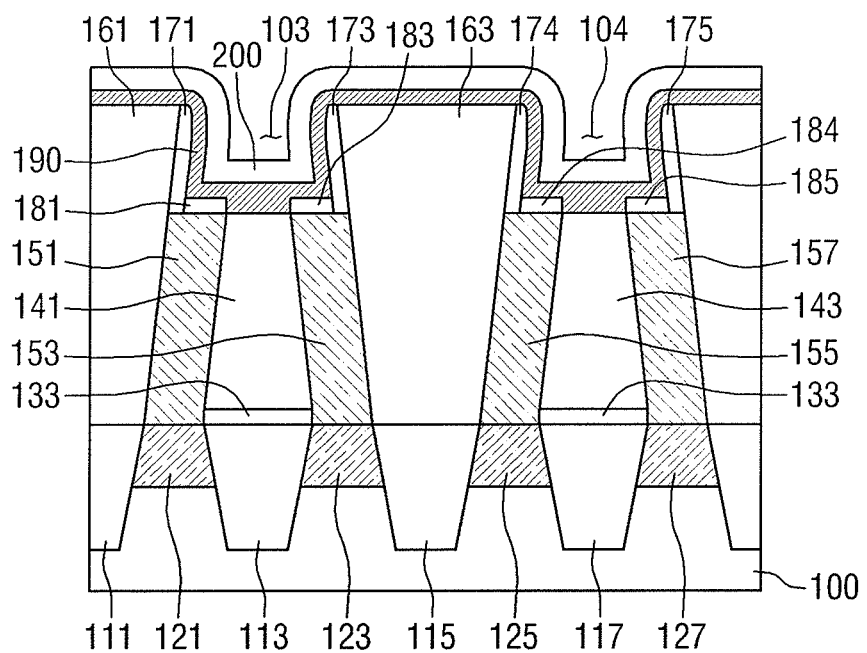

Referring to FIG. 11, a fifth mold layer 200 is, for example, deposited on the lower electrode material 190 along both sidewalls and the bottom surface of the first trench 103 and along both sidewalls and the bottom surface of the second trench 104.

Figure 12:
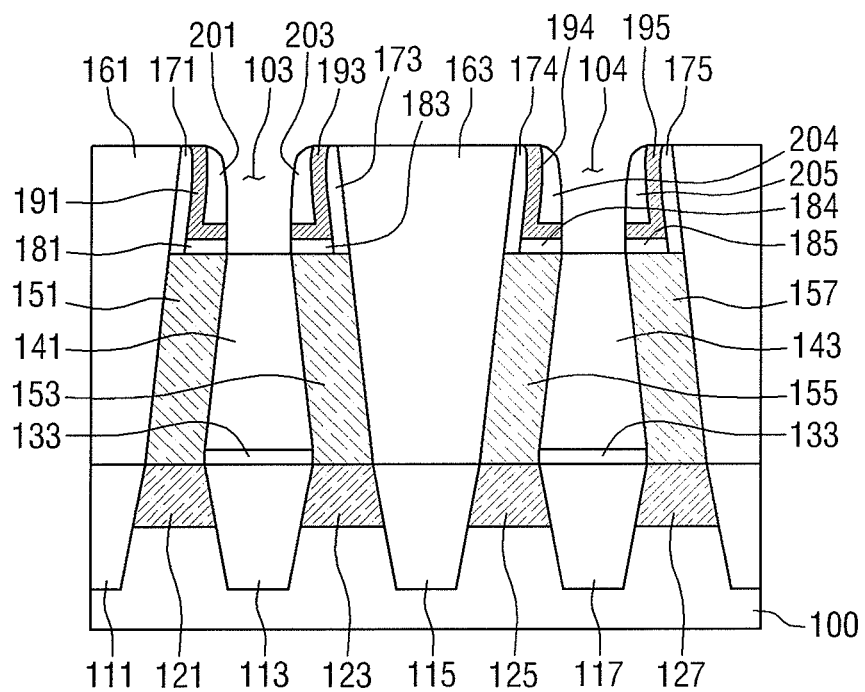

Referring to FIG. 12, fifth and sixth spacers 201 and 203 may, for example, be formed on the fifth and sixth diode electrodes 151 and 153, respectively and seventh and eighth spacers 204 and 205 may, for example, be formed on the seventh and eighth diode electrodes 155 and 157, respectively, by patterning the fifth mold layer 200. For example, the lower electrode material 190 and the fifth mold layer 200 positioned on the third and fourth mold layer patterns 161 and 163 may be etched in the course of forming the fifth to eighth spacers 201, 203, 204 and 205.

In addition, first and second lower electrodes 191 and 193 separated from each other are formed on the fifth and sixth diode electrodes 151 and 153 by, for example, removing a portion of the lower electrode material 190 positioned on the first mold layer pattern 141. Further, third and fourth lower electrodes 194 and 195 separated from each other are formed on the seventh and eighth diode electrodes 155 and 157 by, for example, removing a portion of the lower electrode material 190 positioned on the second mold layer pattern 143.

When the lower electrode material 190 positioned on the first mold layer pattern 141 and the second mold layer pattern 143 is removed by etching, the fifth to eighth spacers 201, 203, 204 and 205 may be used as masks. As the fifth to eighth spacers 201, 203, 204 and 205 are positioned on the lower electrode material 190, portions of the lower electrode material 190 positioned on the fifth to eighth diode electrodes 151, 153, 155 and 157 can be protected during etching. Therefore, only the lower electrode material 190 positioned on the first mold layer pattern 141 and the second mold layer pattern 143 may be removed without damaging the first to fourth lower electrodes 191, 193, 194 and 195.

The first lower electrode 191 and the second lower electrode 193 face each other. In addition, the third lower electrode 194 and the fourth lower electrode 195 face each other. For example, the first and third lower electrodes 191 and 194 may each be L-shaped and the second and fourth lower electrodes 193 and 195 may each be 90-degree counterclockwise rotated L-shaped (⌐-shaped).

In the L-shaped first and third lower electrodes 191 and 194, a bent portion of the first and third lower electrodes 191 and 194 may form an acute angle. In addition, in the ⌐-shaped second and fourth lower electrodes 193 and 195, a bent portion of the second and fourth lower electrodes 193 and 195 may form an acute angle.

The first and second lower electrodes 191 and 193 are positioned on the fifth and sixth diode electrodes 151 and 153, respectively and third and fourth lower electrodes 194 and 195 are positioned on the seventh and eighth diode electrodes 155 and 157, respectively. For example, side surfaces of the first and second lower electrodes 191 and 193 may contact the first and second spacers 171 and 173, respectively, and lower portions of the first and second lower electrodes 191 and 193 may contact the first and second ohmic layer patterns 181 and 183, respectively. Moreover, for example, side surfaces of the third and fourth lower electrodes 194 and 195 may contact the third and fourth spacers 174 and 175, respectively, and lower portions of the third and fourth lower electrodes 194 and 195 may contact the third and fourth ohmic layer patterns 184 and 185, respectively.

Figure 13:
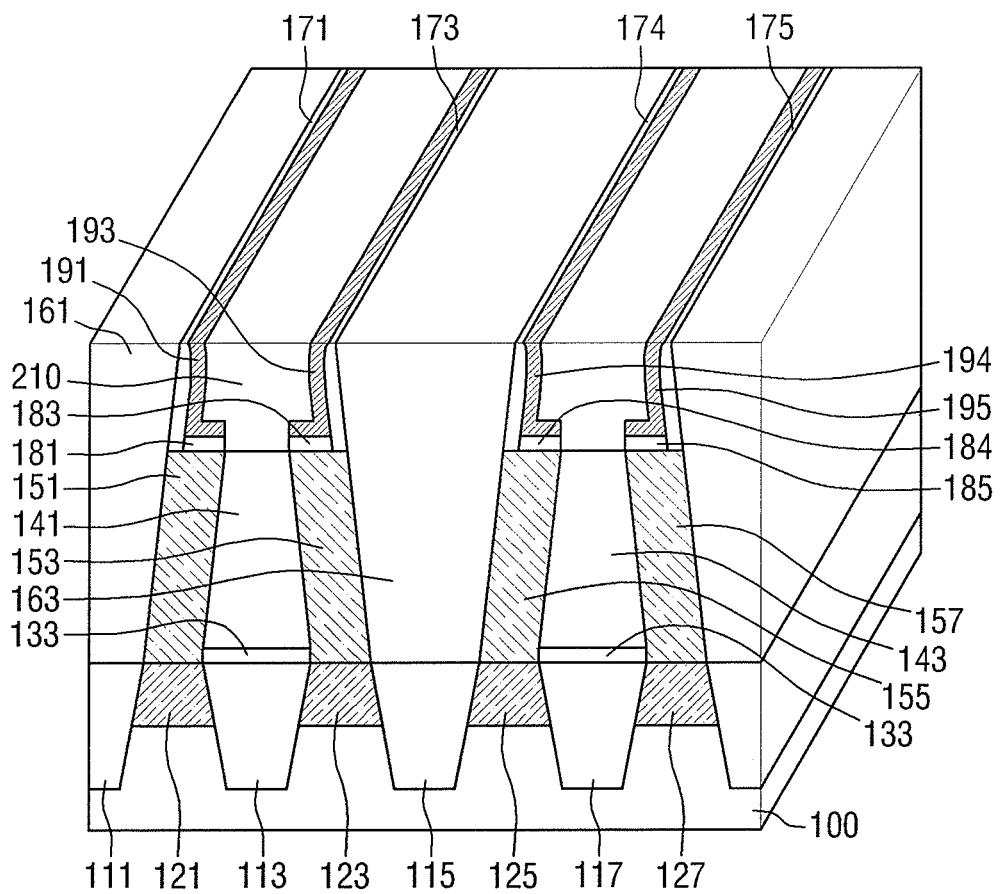

Referring to FIG. 13, a sixth mold layer 210 is, for example, deposited on the first to fourth lower electrodes 191, 193, 194 and 195 to fill the first trench 103 and second trench 104, and then is planarized to expose top surfaces of the first to fourth lower electrodes 191, 193, 194 and 195. The planarizing of the sixth mold layer 210 may be performed by, for example, a chemical mechanical polishing (CMP) or etchback process.

The sixth mold layer 210 may include, for example, SiN.

Figure 14:
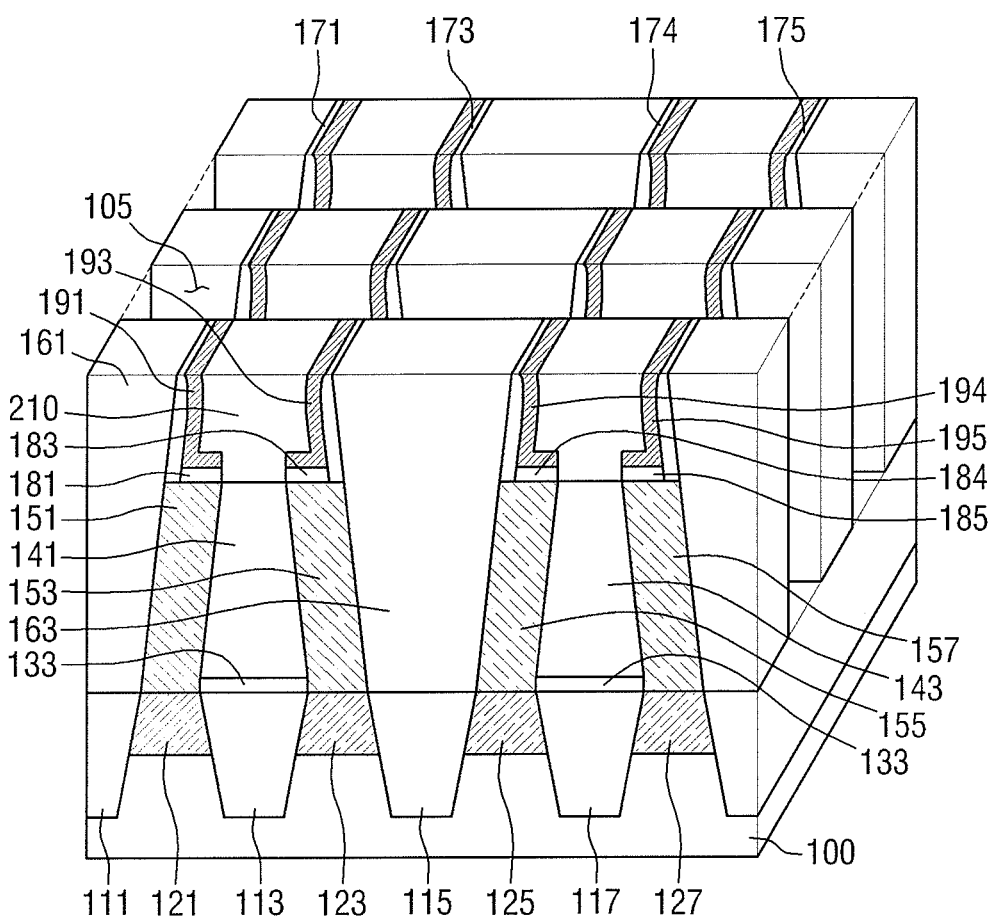

Next, referring to FIG. 14, a third trench 105 may, for example, be formed by removing portions of the first and second lower electrodes 191 and 193, the fifth and sixth diode electrodes 151 and 153, the first, third and fourth mold layer patterns 141, 161 and 163, and the sixth mold layer 210 in a direction perpendicular to a direction in which the first and second lower electrodes 191 and 193 extend. In addition, a fourth trench 106, may, for example, be formed by removing portions of the third and fourth lower electrodes 194 and 195, the seventh and eighth diode electrodes 155 and 157, the second, third and fourth mold layer patterns 143, 161 and 163, and the sixth mold layer 210 in a direction perpendicular to a direction in which the third and fourth lower electrodes 194 and 195 extend.

The forming of the third trench 105 and the fourth trench 106 is, for example, a trimming process of dividing the first to fourth lower electrodes 191, 193, 194 and 195 and the fifth to eighth diode electrodes 151, 153, 155 and 157 into multiple sub-electrodes.

That is to say, a semiconductor device is separated by multiple nodes to form single bit cells. The forming of the third trench 105 and the fourth trench 106 may be performed by, for example, a double patterning process.

Figure 15:
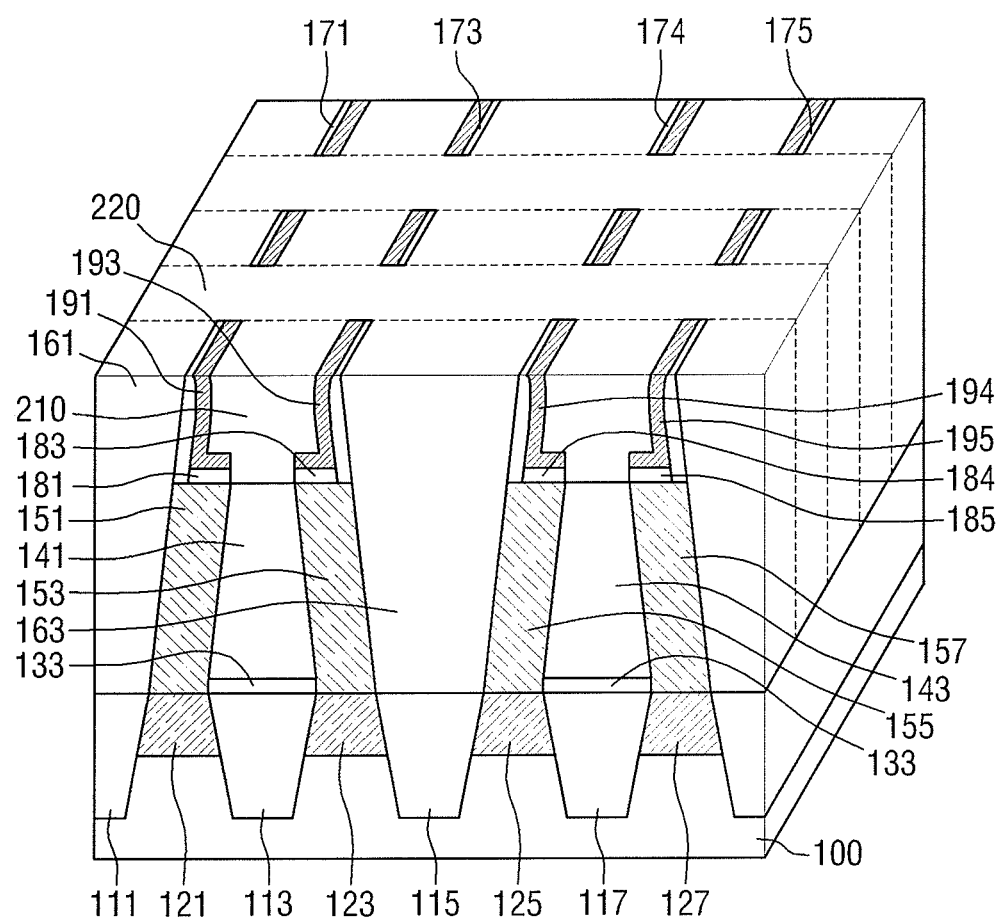

Referring to FIG. 15, a seventh mold layer 220 is, for example, deposited to fill the third trench 105 and the fourth trench 106, and then is planarized to expose top surfaces of the first to fourth lower electrodes 191, 193, 194 and 195. The planarizing of the seventh mold layer 220 may be performed by, for example, a chemical mechanical polishing (CMP) or etch-back process.

The seventh mold layer 220 may include, for example, SiN. After the planarizing of the seventh mold layer 220, the top surfaces of the first to fourth lower electrodes 191, 193, 194 and 195 and top surfaces of the first to fourth spacers 171, 173, 174 and 175 may be exposed.

Figure 16:
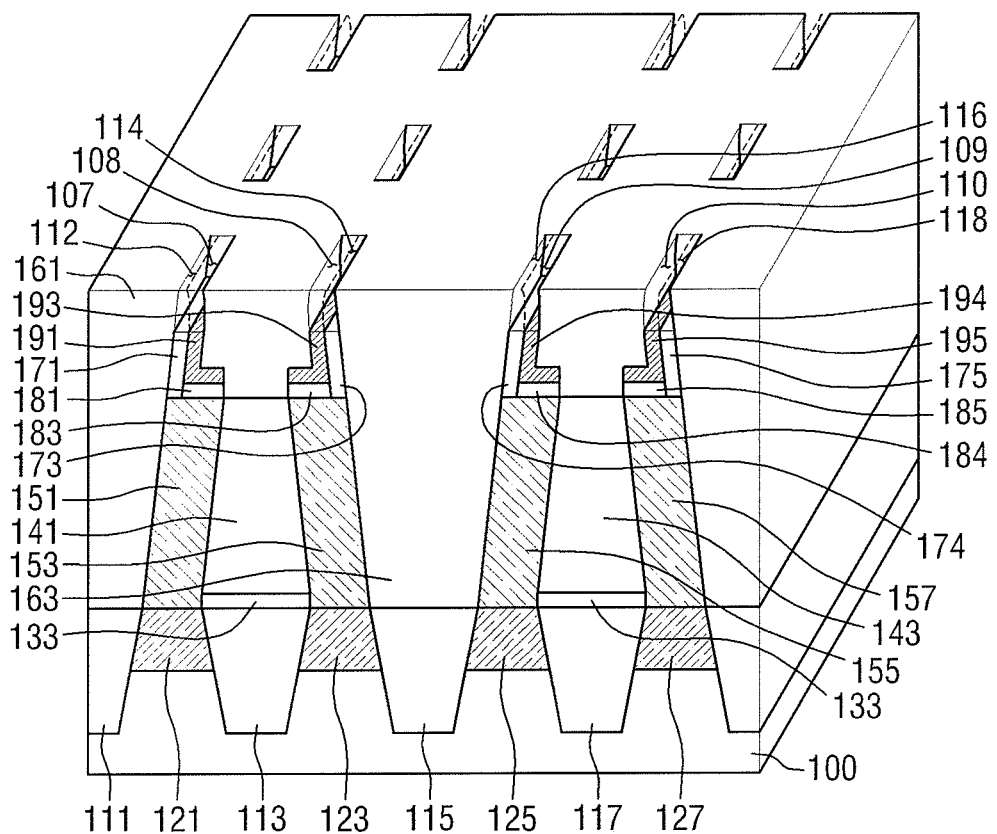

Next, referring to FIG. 16, fifth and sixth trenches 107 and 108 may be formed by, for example, removing portions of the first and second lower electrodes 191 and 193.

Also, seventh and eighth trenches 109 and 110 may be formed by, for example, removing portions of the third and fourth lower electrodes 194 and 195.

For example, before the removing of the portions of the first and second lower electrodes 191 and 193, ninth and tenth trenches 112 and 114 are formed by first removing portions of the first and second spacers 171 and 173, respectively. Similarly, before the removing of the portions of the third and fourth lower electrodes 194 and 195, eleventh and twelfth trenches 116 and 118 are formed by first removing portions of the third and fourth spacers 174 and 175, respectively. The first to fourth spacers 171, 173, 174 and 175 may be selectively removed using, for example, HF. For example, as described above, the third and fourth mold layer patterns 161 and 163 may be formed from a second material and the first to fourth spacers 171, 173, 174 and 175 may be formed from a third material different from the first material. That is to say, the first to fourth spacers 171, 173, 174 and 175 may be selectively etched using an etching gas or etching solution having a higher etch rate to the third material than to the second material.

After the removing of the portions of the first to fourth spacers 171, 173, 174 and 175, the portions of the first to fourth lower electrodes 191, 193, 194 and 195 may be removed by, for example, dry etching. If the portions of the first to fourth spacers 171, 173, 174 and 175 are first removed, spaces may be secured at side surfaces of the first to fourth lower electrodes 191, 193, 194 and 195. The removing of the first to fourth lower electrodes 191, 193, 194 and 195 is facilitated using the spaces secured by forming the ninth to twelfth trenches 112, 114, 116 and 118.

Figure 17:
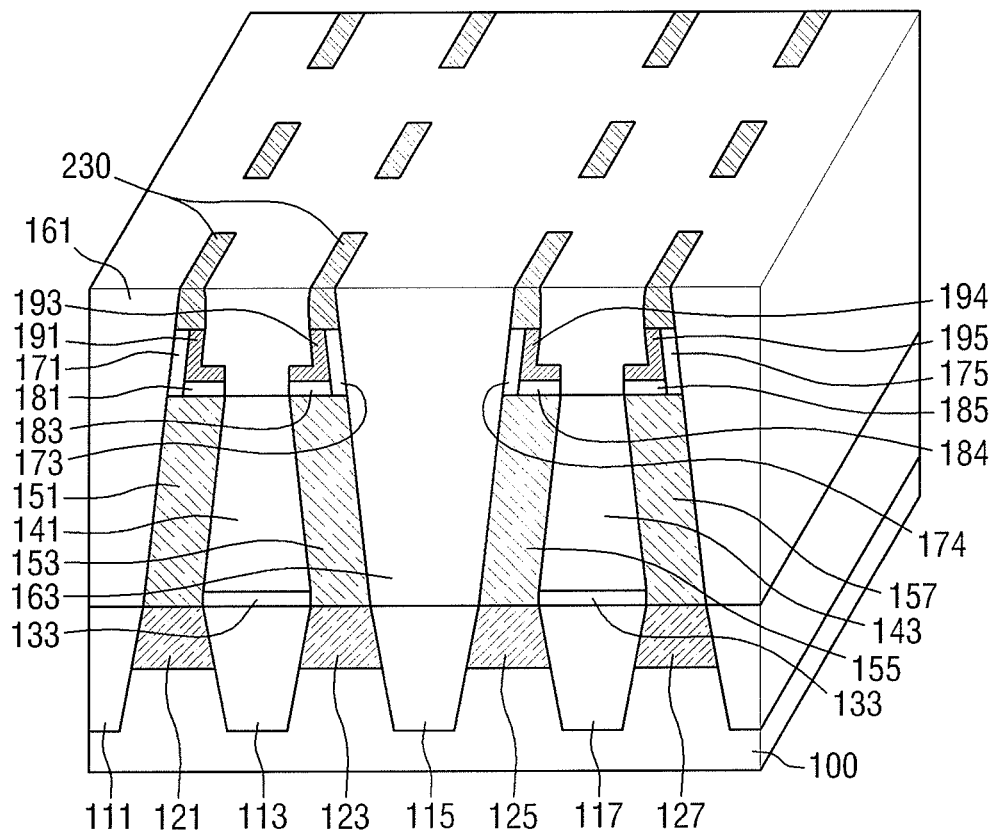

Referring to FIG. 17, a phase change material 230 may, for example, be deposited to fill the fifth to twelfth trenches 107, 108, 109, 110, 112, 114, 116 and 118.

The phase change material 230 may include, for example, at least one selected from the group consisting of geinianium antimony tellurium (GeSbTe), germanium tellurium arsenic (GeTeAs), tin tellurium tin (SnTeSn), germanium telluride (GeTe), antimony telluride (SbTe), selenium tellurium tin (SeTeSn), germanium tellurium selenide (GeTeSe), antimony selenium bismuth (SbSeBi), germanium bismuth telluride (GeBiTe), germanium tellurium titanium (GeTeTi), indium selenium (InSe), gallium tellurium selenide (GaTeSe) and indium antimony telluride (InSbTe). In addition, at least one material selected among, for example, carbon (C), nitrogen (N), silicon (Si) and oxygen (O) may be doped into the phase change material 230, but exemplary embodiments are not limited thereto. Alternatively, the phase change material 230 may be formed from different kinds of materials.

Next, an upper electrode (not shown) may be formed on the phase change material 230.

In the method of manufacturing a semiconductor device according to an embodiment of the present invention, the first to fourth lower electrodes 191, 193, 194 and 195 may be formed without performing a photolithography process. For example, to form the first to fourth lower electrodes 191, 193, 194 and 195, the first trench 103 and the second trench 104 are formed by selective etching, and the lower electrode material 190 is deposited on the first trench 103 and the second trench 104, followed by performing a trimming process to separate the lower electrode material 190 into first to fourth lower electrodes 191, 193, 194 and 195.

In addition, in the method of manufacturing a semiconductor device according to an embodiment of the present invention, the phase change material 230 can be formed without performing a photolithography process. For example, to form the phase change material 230, portions of the first to fourth lower electrodes 191, 193, 194 and 195 are removed by dry etching, giving trenches. Then, the phase change material 230 is deposited on the resulting trenches.

As described above, in the method of manufacturing a semiconductor device according to an embodiment of the present invention, the number of photography processes can be minimized while manufacturing a PRAM, thereby reducing the manufacturing cost and manufacturing time.

A cross-section of a semiconductor device manufactured by the manufacturing method according to this embodiment of the present invention will be described with reference to FIG. 17.

For example, the semiconductor device includes third, first and fourth mold layer patterns 161, 141 and 163 sequentially disposed on the substrate 100. The semiconductor device further includes a fifth diode electrode 151 disposed between the third mold layer pattern 161 and the first mold layer pattern 141, a sixth diode electrode 153 disposed between the first mold layer pattern 141 and the fourth mold layer pattern 163, a first lower electrode 191 farmed on the fifth diode electrode 151 and having an L-shape, and a second lower electrode 193 formed on the sixth diode electrode 153, having a 90-degree counterclockwise rotated L-shape (⌐-shape), and separated from the first lower electrode 191. Moreover, the semiconductor device further includes a seventh diode electrode 155 disposed between the fourth mold layer pattern 163 and the second mold layer pattern 143, an eighth diode electrode 157 disposed on a sidewall of the second mold layer pattern 143 and on the fourth diode electrode 127, a third lower electrode 194 formed on the seventh diode electrode 155 and having an L-shape, and a fourth lower electrode 195 formed on the eighth diode electrode 157, having a 90-degree counterclockwise rotated L-shape (⌐-shape), and separated from the third lower electrode 194.

In the L-shaped first and third lower electrodes 191 and 194, a bent portion of the first and third lower electrodes 191 and 194 may form an acute angle. In addition, in the ⌐-shaped second and fourth lower electrodes 193 and 195, a bent portion of the second and fourth lower electrodes 193 and 195 may form an acute angle.

The semiconductor device may further include, for example, a first spacer 171 disposed between the first lower electrode 191 and the third mold layer pattern 161 and formed on the fifth diode electrode 151, and a second spacer 173 disposed between the second lower electrode 193 and the fourth mold layer pattern 163 and formed on the sixth diode electrode 153. Further, the semiconductor device may include a third spacer 174 disposed between the third lower electrode 194 and the fourth mold layer pattern 163 and formed on the seventh diode electrode 155, and a fourth spacer 175 disposed between the fourth lower electrode 195 and a sidewall of the second trench 104 and formed on the eighth diode electrode 157.

Additionally, the semiconductor device may further include, for example, a first ohmic layer pattern 181 formed between the fifth diode electrodes 151 and the first lower electrode 191, and a second ohmic layer pattern 183 formed between the sixth diode electrodes 153 and the second lower electrode 193. Also, the semiconductor device may further include, for example, a third ohmic layer pattern 184 formed between the seventh diode electrode 155 and the third lower electrode 194, and a fourth ohmic layer pattern 185 formed between the eighth diode electrode 157 and the fourth lower electrode 195.

Figure 18:
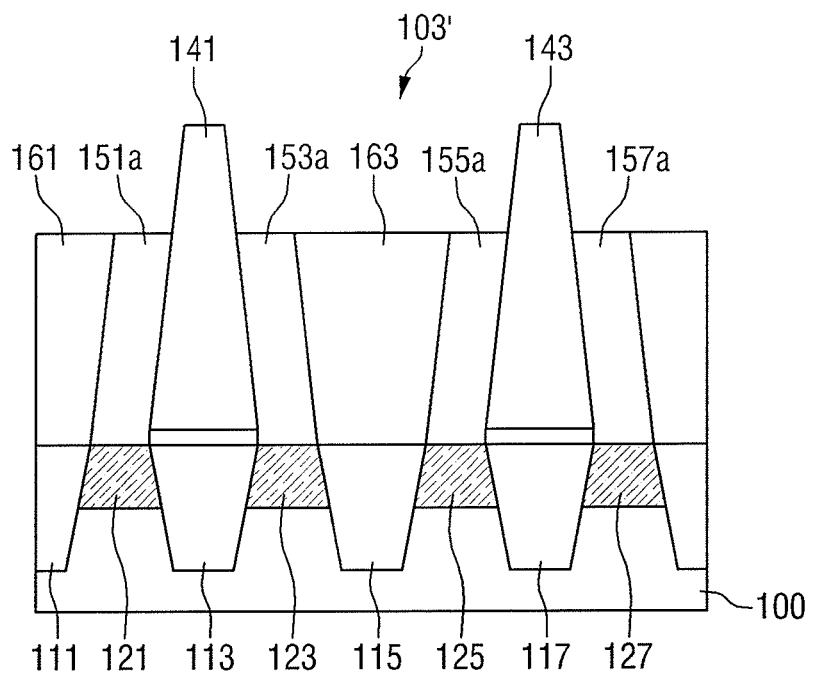
FIGS. 18 to 20 are cross-sectional views of a semiconductor device, for explaining a method of manufacturing a semiconductor device according to an exemplary embodiment of the present invention.
Figure 19:
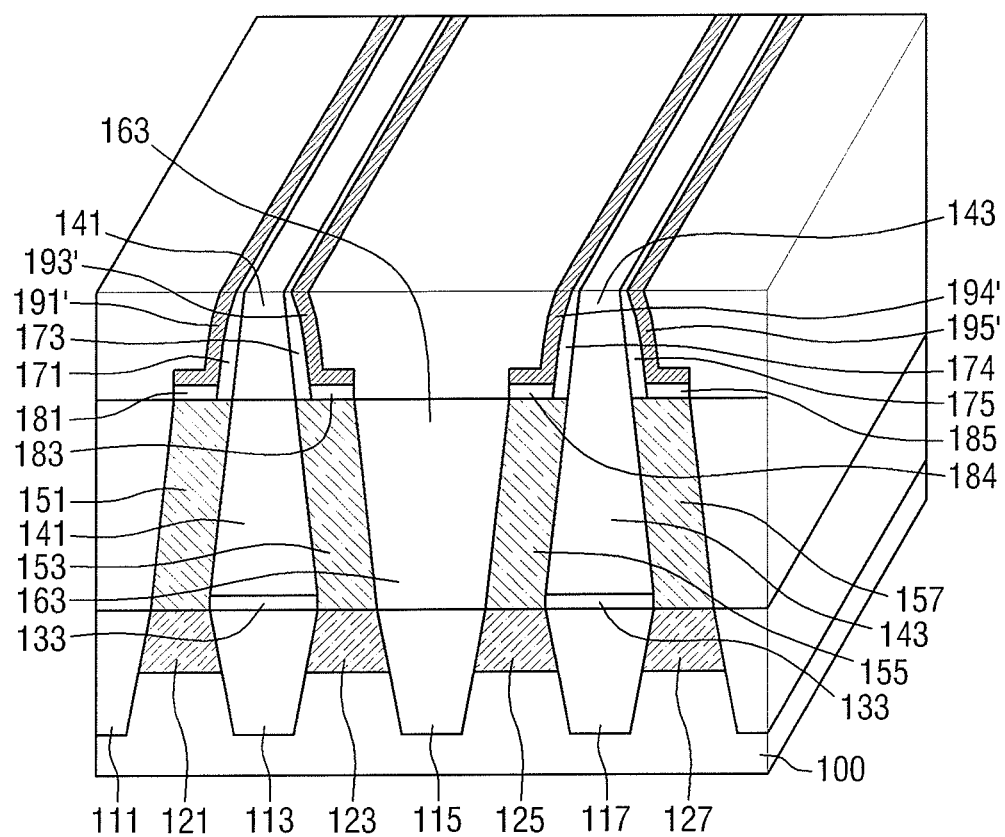
Figure 20:
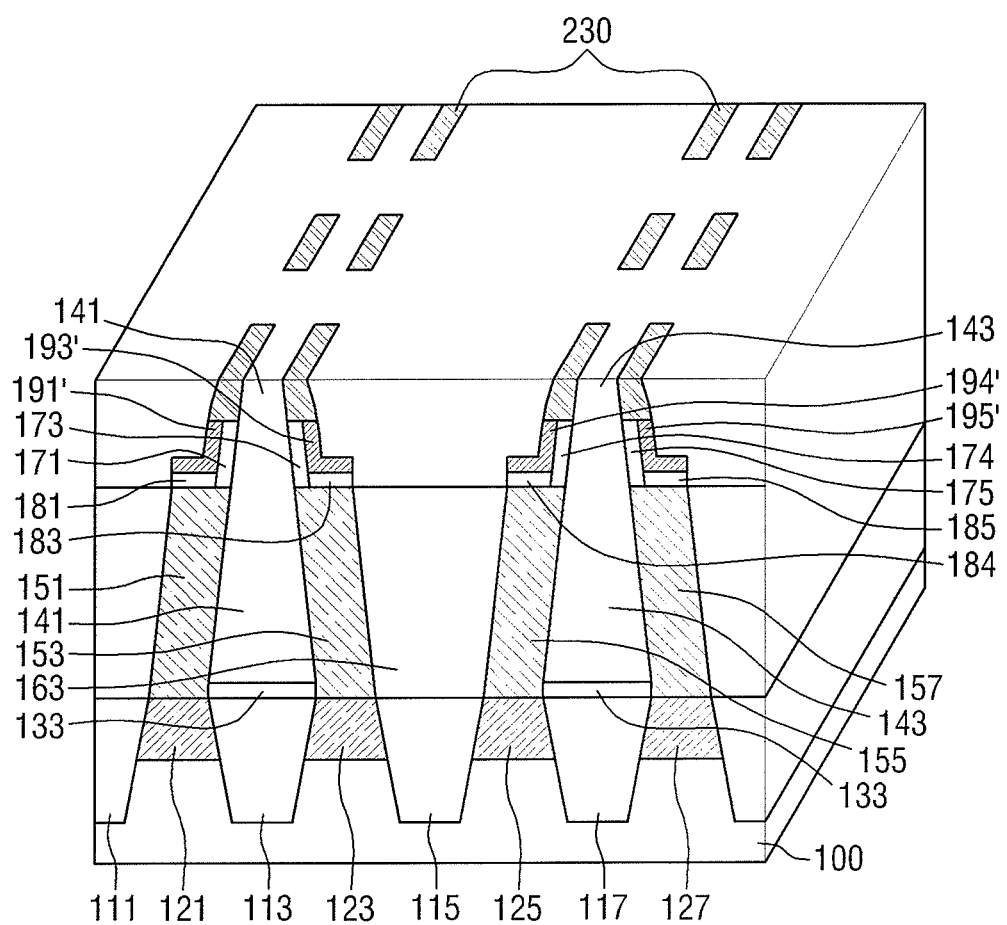

A method of manufacturing a semiconductor device according to an embodiment of the present invention will now be described with reference to FIGS. 1 to 6 and FIGS. 18 to 20. However, the following description will focus on differences between the semiconductor devices of FIGS. 1 to 17 and FIGS. 18 to 20. FIGS. 18 to 20 are cross-sectional views of a semiconductor device, for explaining a method of manufacturing a semiconductor device according to an embodiment of the present invention.

As described above, processes of the method of manufacturing the semiconductor device as shown in FIGS. 1 to 6 are performed.

Next, referring to FIG. 18, a first trench 103' is formed between the first mold layer pattern 141 and the second mold layer pattern 143 by, for example, removing a portion of the fourth mold layer pattern 163 and portions of the second and third semiconductor patterns 153a and 155a.

The fourth mold layer pattern 163 may be selectively removed using, for example, phosphoric acid ($H_3PO_4$). For example, as described above, the first and second mold layer patterns 141 and 143 may be formed from a first material and the fourth mold layer pattern 163 may be formed from a second material different from the first material. Therefore, the fourth mold layer pattern 163 may be selectively etched using an etching gas or etching solution having a higher etch rate to the second material than to the first material.

The second and third semiconductor patterns 153a and 155a may be removed by, for example, dry etching. For example, the second and third semiconductor patterns 153a and 155a may be removed using, for example, an etching-back process, but exemplary embodiments are not limited thereto.

After the fourth mold layer pattern 163 is first removed, the second and third semiconductor patterns 153a and 155a may then be removed. However, exemplary embodiments of the invention are not limited to the removal order of the illustrated example. Alternatively, the second and third semiconductor patterns 153a and 155a may first be removed.

Sidewalls of the first trench 103' may have, for example, a positive profile. That is to say, the sidewalls of the first trench 103' may have a positive slope when a width of the first trench 103' gradually increases upwardly.

Next, referring to FIGS. 19 and 20, first to fourth lower electrodes 191, 193, 194 and 195 and a phase change material 230 may be formed.

The processes of forming the first to fourth lower electrodes 191, 193, 194 and 195 and the phase change material 230 are the substantially the same as those of the manufacturing method according to the methods described in FIGS. 8-17. Thus, the method of manufacturing the semiconductor device according to the present embodiment can be implemented by one skilled in the related art by referring to the manufacturing method according to the methods described in FIGS. 1 to 6 and 8-17.

A cross-section of a semiconductor device manufactured by the manufacturing method according to this embodiment of the present invention will be described with reference to FIG. 20 It is noted that the positioning of the lower electrodes in relation to each other in the semiconductor device illustrated in FIG. 20 have been modified in comparison to the positioning of the lower electrodes in relation to each other illustrated in FIG. 17. The same reference numerals will be used in the present exemplary embodiment to refer to elements which are the same as those illustrated in the semiconductor device of FIG. 17.

For example, the semiconductor device of FIG. 20 includes first, fourth and second mold layer patterns 141, 163 and 143 sequentially disposed on a substrate 100, a fifth diode electrode 151 disposed between the first mold layer pattern 141 and the third mold layer pattern 161, a sixth diode electrode 153 disposed between the first mold layer pattern 141 and the fourth mold layer pattern 163, a seventh diode electrode 155 disposed between the fourth mold layer pattern 163 and the second mold layer pattern 143 and an eighth diode electrode 157 disposed on a sidewall of the second mold layer pattern 143 which is opposite to a sidewall of the second mold layer pattern 143 on which the seventh diode electrode 155 is formed. The semiconductor device further includes a first lower electrode 191' formed on the fifth diode electrode 151, having a 90-degree counterclockwise rotated L-shape (⌐-shape) and a second lower electrode 193' formed on the sixth diode electrode 153, having an L-shape and separated from the first lower electrode 191'. The semiconductor device further includes a third lower electrode 194' formed on the seventh diode electrode 155, having a 90-degree counterclockwise rotated L-shape (⌐-shape), and a fourth lower electrode 195' formed on the eighth diode electrode 157, having an L-shape.

In the L-shaped second and fourth lower electrode 193' and 195', a bent portion of the second and fourth lower electrodes 193' and 195' may form an obtuse angle. In addition, in the ⌐-shaped first and third lower electrodes 191' and 194', a bent portion of the first and third lower electrodes 191' and 194' may form an obtuse angle.

The semiconductor may further include, for example, a first spacer 171 disposed between the first lower electrode 191' and the first mold layer pattern 141 and formed on the fifth diode electrodes 151, and a second spacer 173 disposed between the second lower electrode 193' and the first mold layer pattern 141 and formed on the sixth diode electrode 153. In addition, the semiconductor may further include, for example, a third spacer 174 disposed between the third lower electrode 194' and the second mold layer pattern 143 and formed on the seventh diode electrodes 155, and a fourth spacer 175 disposed between the fourth lower electrode 195' and the second mold layer pattern 143 and formed on the eighth diode electrode 157.

Additionally, the semiconductor device may further include, for example, a first ohmic layer pattern 181 formed between the fifth diode electrode 151 and the first lower electrode 191', and a second ohmic layer pattern 183 formed between the sixth diode electrode 153 and the second lower electrode 193'. Also, the semiconductor device may further include, for example, a third ohmic layer pattern 184 formed between the seventh diode electrode 155 and the third lower electrode 194', and a fourth ohmic layer pattern 185 formed between the eighth diode electrode 157 and the fourth lower electrode 195'.

Methods of manufacturing semiconductor devices according to an embodiment of the present invention will now be described with reference to FIGS. 21 and 22.

However, the following description will focus on differences between the methods described in FIGS. 1 to 17 and FIGS. 21 and 22. FIGS. 21 and 22 are cross-sectional views of semiconductor devices, for explaining methods of manufacturing semiconductor devices according to an embodiment of the present invention.

Figure 21:
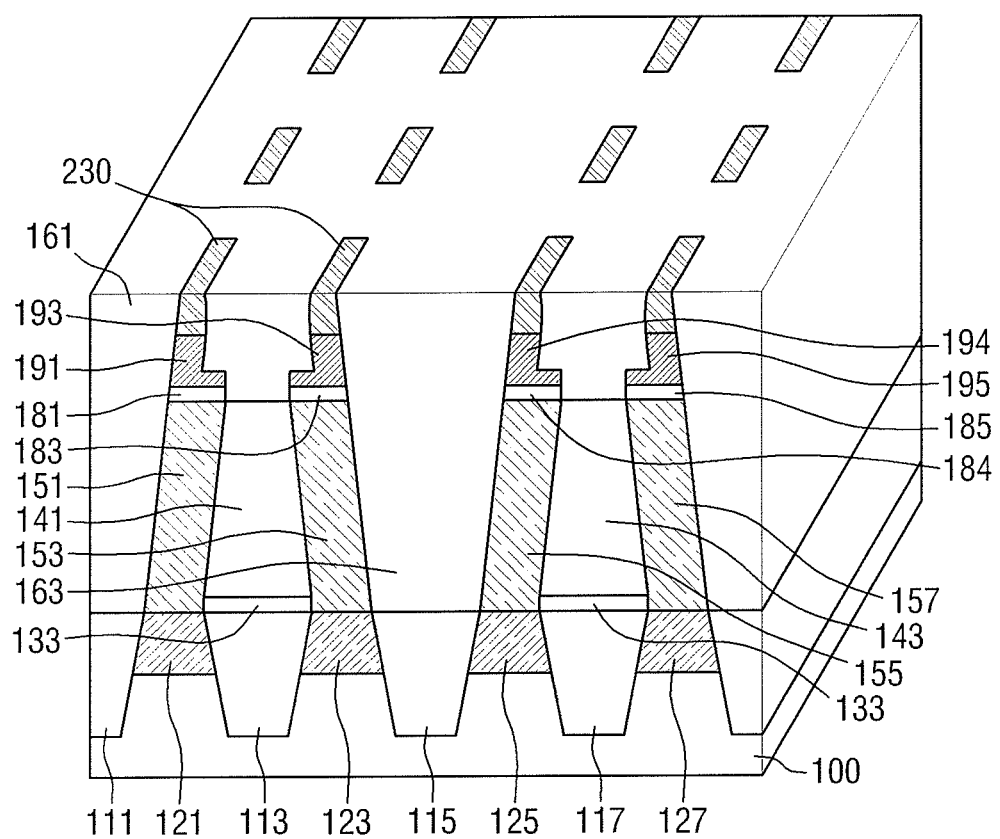
FIGS. 21 and 22 are cross-sectional views of semiconductor devices, for explaining methods of manufacturing semiconductor devices according to an exemplary embodiment of the present invention.

The manufacturing method according to the embodiment shown in FIG. 21 is substantially the same as that according to the methods shown in FIGS. 1 to 17, except that first to fourth spacers 171, 173, 174 and 175 are not formed. That is to say, as shown in FIG. 21, the semiconductor device manufactured by the manufacturing method according to the present embodiment does not include first to fourth spacers 171, 173, 174 and 175.

Figure 22:
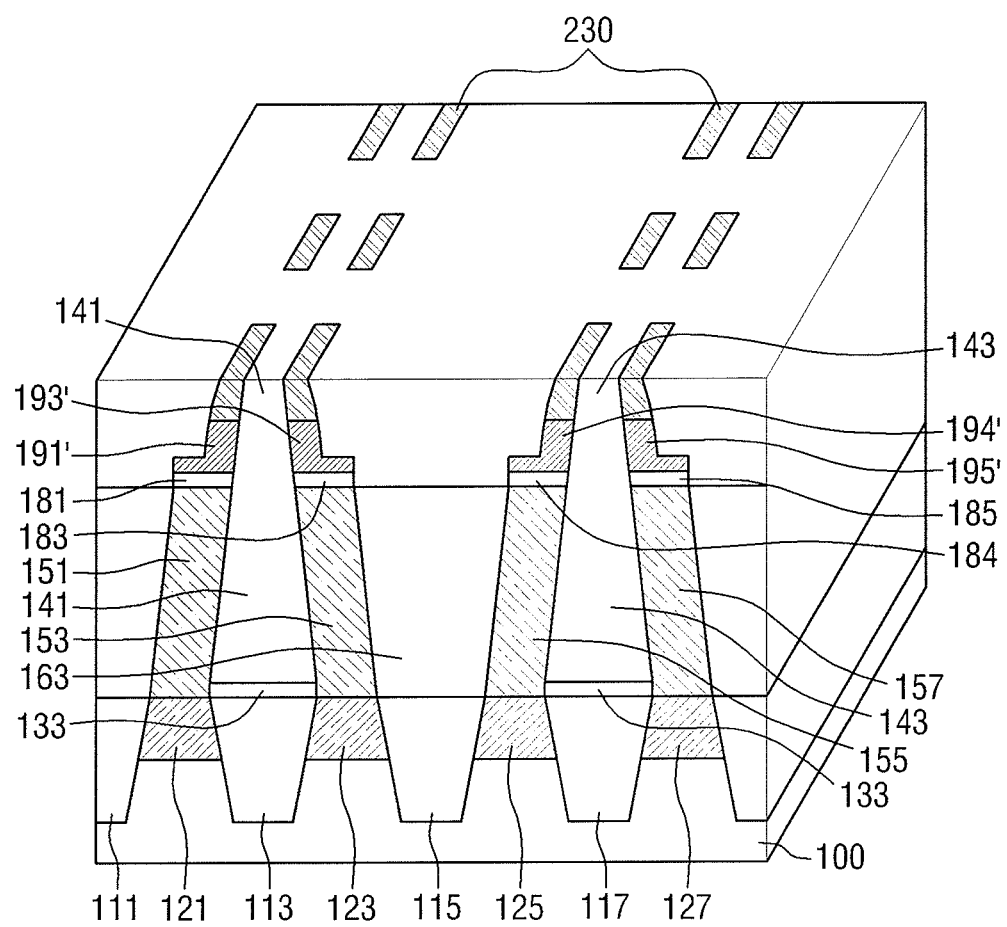

The manufacturing method according to the embodiment shown in FIG. 22 is substantially the same as that according to the methods shown in FIGS. 1 to 6 and FIGS. 18 to 20, except that first to fourth spacers 171, 173, 174 and 175 are not formed. That is to say, as shown in FIG. 22, the semiconductor device manufactured by the manufacturing method according to the present embodiment does not include first to fourth spacers 171, 173, 174 and 175.

Having described exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor device, the method comprising:
   sequentially forming a first mold layer pattern, a second mold layer pattern, and a third mold layer pattern on a substrate, wherein the first to third mold layer patterns are spaced apart from each other;
   forming a first semiconductor pattern between the first mold layer pattern and the second mold layer pattern, and a second semiconductor pattern between the second mold layer pattern and the third mold layer pattern;
   forming a first trench between the first mold layer pattern and the third mold layer pattern by removing a portion of the second mold layer pattern and portions of the first and second semiconductor patterns;
   depositing a material for a lower electrode conformally along side and bottom surfaces of the first trench; and
   forming a first lower electrode and a second lower electrode separated from each other on the first and second semiconductor patterns, respectively, by removing a portion of the material for a lower electrode positioned on the second mold layer pattern.

2. The method of claim 1, wherein the first mold layer pattern and the third mold layer pattern are formed from a first material and the second mold layer pattern is formed from a second material different from the first material.

3. The method of claim 1, wherein the first lower electrode is L-shaped and the second lower electrode is a 90-degree counterclockwise rotated L-shaped (⌐-shaped).

4. The method of claim 1, wherein the substrate includes a first isolation region, a second isolation region and a third isolation region spaced apart from each other and formed under the first to third mold layer patterns.

5. The method of claim 4, wherein the substrate further includes a first diode electrode of a first conductivity type formed between the first and second isolation regions, and a second diode electrode of first conductivity type formed between the second and third isolation regions, and wherein after the forming of the first trench and before the depositing the lower electrode material, the method further comprises forming a third diode electrode and a fourth diode electrode by implanting second conductivity type dopants into the first and second semiconductor patterns, respectively.

6. The method of claim 1, further comprising:
   depositing a fourth mold layer on the first and second lower electrodes to fill the first trench;
   planarizing the fourth mold layer to expose top surfaces of the first and second lower electrodes;
   forming a second trench and a third trench by removing portions of the first and second lower electrodes, respectively; and
   depositing a phase change material on the second and third trenches.

7. The method of claim 6, wherein after the forming of the first trench and before the depositing of the lower electrode material, further comprising forming a first spacer and a second spacer on opposing sidewalls of the first trench.

8. The method of claim 7, wherein the first and third mold layer patterns are formed from a first material and the first and second spacers are formed from a third material different from the first material.

9. The method of claim 7, wherein after the planarizing of the fourth mold layer and before the forming of the second and third trenches, the method further comprising forming a fourth trench and a fifth trench by removing portions of the first and second spacers, respectively, and wherein the depositing of the phase change material comprises depositing the phase change material to fill the second to fifth trenches.

10. The method of claim 6, wherein after the planarizing of the fourth mold layer and before the forming of the second and third trenches, the method further comprising:
   forming a sixth trench by removing the first and second lower electrodes, the first and second semiconductor patterns, the first to third mold layer patterns, and the fourth mold layer in a direction perpendicular to a direction in which the first and second lower electrodes extend;
   depositing a fifth mold layer to fill the sixth trench; and
   planarizing the fifth mold layer to expose top surfaces of the first and second lower electrodes.

11. The method of claim 1, wherein after the forming of the first trench and before the depositing of the lower electrode material, the method further comprising:
   forming a third diode electrode and a fourth diode electrode by implanting second conductivity dopants into the first and second semiconductor patterns, respectively;

forming a first ohmic layer pattern and a second ohmic layer pattern on the third and fourth diode electrodes respectively, wherein the depositing of the lower electrode material comprises depositing the lower electrode material conformally on the first and second ohmic layer patterns while depositing the lower electrode material conformally along a side and bottom surface of the first trench.

12. The method of claim 1, wherein after the depositing the lower electrode material and before the removing the portion of the lower electrode material, the method further comprising:

depositing a sixth mold layer on the lower electrode material conformally along the side and bottom surfaces of the first trench; and forming a third spacer and a fourth spacerson the first semiconductor pattern and the second semiconductor pattern, respectively, by patterning the sixth mold layer;

wherein the removing of the portion of the lower electrode material comprises removing the portion of the lower electrode material using the third and fourth spacers as masks.

13. A method of manufacturing a semiconductor device comprising:

forming a first mold layer pattern on a substrate, and a first semiconductor pattern and a second semiconductor pattern on opposing sidewalls of the first mold layer pattern;

depositing a first mold layer on the substrate, the first mold layer pattern, and the first and second semiconductor patterns;

forming a second mold layer pattern on side surfaces of the first semiconductor pattern and a third mold layer pattern on side surfaces of the second semiconductor pattern by planarizing the first mold layer to expose a top surface of the first mold layer pattern and top surfaces of the first and second semiconductor patterns;

forming a first trench between the second mold layer pattern and the third mold layer pattern by removing a portion of the first mold layer pattern and portions of the first and second semiconductor patterns;

depositing a material for a lower electrode conformally along side and bottom surfaces of the first trench; and forming a first lower electrode and a second lower electrode separated from each other on the first and second semiconductor patterns, respectively, by removing a portion of the lower electrode material positioned on the first mold layer pattern.

14. The method of claim 13, wherein the first mold layer pattern is formed from a first material and the second and third mold layer patterns are formed from a third material different from the first material.

15. The method of claim 13, wherein the first lower electrode is L-shaped and the second lower electrode is a 90-degree counterclockwise rotated L-shaped (⌐-shaped).

16. The method of claim 13, wherein after the forming of the first trench and before the depositing of the lower electrode material, the method further comprising forming first and second spacers on opposing sidewalls of the first trench.

17. The method of claim 14, wherein the portion of the first mold layer pattern is removed using hydrogen fluoride (HF).

18. A method of manufacturing a semiconductor device comprising:

forming a first isolation region, a second isolation region, a third isolation region and a fourth isolation region spaced apart from each other in a semiconductor substrate;

forming a first diode electrode between the first and second isolation regions, a second diode electrode between the second and third diode electrodes, a third diode electrode between the third and fourth isolation regions and a fourth diode electrode on a side of the fourth isolation region opposite to a side of the fourth isolation region on which the third diode electrode is formed;

sequentially forming an etch stop layer and a first mold layer on the substrate;

forming a first mold layer pattern and a second mold layer pattern by patterning the first mold layer and the etch stop layer using a double patterning process and wherein the first and second mold layer patterns have inclined sidewalls;

forming a semiconductor layer conformally on the substrate and the first and second mold layer patterns;

patterning the semiconductor layer to form a first semiconductor pattern and a second semiconductor pattern on opposing sidewalls of the first mold layer pattern and a third semiconductor pattern and a fourth semiconductor pattern on opposing sidewalls of the second mold layer pattern and wherein the second and third semiconductor patterns are positioned between the first and second mold layer patterns and spaced apart from each other;

forming a third mold layer pattern on a sidewall of the first semiconductor pattern and on the first isolation region and a fourth mold layer pattern on the third isolation region and between the second and third semiconductor patterns and wherein opposing sidewalls of each of the third and fourth mold layer patterns are inclined;

forming a first trench between the third mold layer pattern and the fourth mold layer pattern by removing a portion of the first mold layer pattern and portions of the first and second semiconductor patterns;

forming a second trench on the second mold layer pattern and the third and fourth semiconductor patterns by removing a portion of the second mold layer pattern and portions of the third and fourth semiconductor patterns;

transforming the first and second semiconductor patterns into a fifth diode electrode and a sixth diode electrode, respectively, by implanting dopants of a first conductivity type into the first and second semiconductor patterns;

transforming the third and fourth semiconductor patterns into a seventh diode electrode and an eighth diode electrode, respectively, by implanting dopants of the first conductivity type into the third and fourth semiconductor patterns;

forming a first ohmic layer pattern on the fifth diode electrode, a second ohmic layer pattern on sixth diode electrode, a third ohmic layer pattern on the seventh diode electrode and a fourth ohmic layer pattern on the eighth diode electrode;

forming a material for a lower electrode conformally alone side and bottom surfaces of the first trench and the second trench;

forming a first lower electrode and second lower electrode separated from each other on the fifth diode electrode and the sixth diode electrode, respectively by removing a portion of the lower electrode material positioned on the first mold layer pattern; and forming a third lower electrode and fourth lower electrode separated from each other on the seventh diode electrode and the eighth diode electrode, respectively by removing a portion of the lower electrode material positioned on the second mold layer pattern.

19. The method of claim 18, wherein the first lower electrode is L-shaped and the second lower electrode is a 90-degree counterclockwise rotated L-shaped (⌐-shaped), and wherein prior to forming the fifth to eight diode electrodes, the method further comprising forming a first spacer and a second spacer on opposing sidewalls of the first trench, wherein the first and second spacers make contact with the first and second semiconductor patterns, respectively; and forming a third spacer and a fourth spacer on opposing sidewalls of the second trench, wherein the third and fourth spacers make contact with the third and fourth semiconductor patterns, respectively.

20. The method of claim 18, wherein the first and second lower electrodes do not face each other, wherein the second and third lower electrodes face each other and wherein the third and fourth lower electrodes do not face each other.

\* \* \* \* \*